United States Patent
Chen

(10) Patent No.: US 9,797,041 B2
(45) Date of Patent: Oct. 24, 2017

(54) SYSTEM AND METHOD FOR FORMING A THIN-FILM PHOSPHOR LAYER FOR PHOSPHOR-CONVERTED LIGHT EMITTING DEVICES

(71) Applicant: Maven Optronics Corp., Santa Clara, CA (US)

(72) Inventor: Chieh Chen, Palo Alto, CA (US)

(73) Assignee: MAVEN OPTRONICS CORP., Palo Alto, CA (US)

( * ) Notice: Subject to any disclaimer, the term of this patent is extended or adjusted under 35 U.S.C. 154(b) by 347 days.

(21) Appl. No.: 14/709,416

(22) Filed: May 11, 2015

(65) Prior Publication Data

US 2015/0275372 A1 Oct. 1, 2015

Related U.S. Application Data

(62) Division of application No. 12/617,673, filed on Nov. 12, 2009, now abandoned.

(Continued)

(51) Int. Cl.
| | | |
|---|---|---|
| *C23C 16/52* | (2006.01) | |
| *C09K 11/02* | (2006.01) | |
| *C09K 11/08* | (2006.01) | |
| *H01J 1/64* | (2006.01) | |
| *H01J 1/68* | (2006.01) | |

(Continued)

(52) U.S. Cl.
CPC ............ *C23C 16/52* (2013.01); *C09K 11/025* (2013.01); *C09K 11/08* (2013.01); *C23C 16/4584* (2013.01); *C23C 16/45565* (2013.01); *H01J 1/64* (2013.01); *H01J 1/68* (2013.01); *H01J 1/70* (2013.01); *H05B 33/145* (2013.01); *H01L 33/501* (2013.01); *H01L 51/0006* (2013.01); *H01L 2933/0041* (2013.01); *Y10T 428/3154* (2015.04); *Y10T 428/31544* (2015.04); *Y10T 428/31855* (2015.04)

(58) Field of Classification Search
None
See application file for complete search history.

(56) References Cited

U.S. PATENT DOCUMENTS

| | | |
|---|---|---|
| 3,593,678 A | 7/1971 | Miller |
| 5,567,468 A | 10/1996 | Lucas |

(Continued)

FOREIGN PATENT DOCUMENTS

| | | |
|---|---|---|
| EP | 1 286 364 A2 | 2/2003 |
| EP | 1 441 019 A1 | 7/2004 |

(Continued)

OTHER PUBLICATIONS

Written Opinion of the International Searching Authority provided for PCT/US09/064434 (WO/2010/057023).*

(Continued)

*Primary Examiner* — Charles Capozzi
(74) *Attorney, Agent, or Firm* — Foley & Lardner LLP; Cliff Z. Liu

(57) ABSTRACT

A thin-film phosphor layer can be formed by an improved deposition method involving: (1) forming a phosphor powder layer that is substantially uniformly-deposited on a substrate surface; and (2) forming a polymer binder layer to fill gaps among loosely packed phosphor particles, thereby forming a substantially continuous layer of thin film.

8 Claims, 8 Drawing Sheets

Related U.S. Application Data

(60) Provisional application No. 61/114,198, filed on Nov. 13, 2008.

(51) Int. Cl.
*H01J 1/70* (2006.01)
*H05B 33/14* (2006.01)
*C23C 16/455* (2006.01)
*C23C 16/458* (2006.01)
*H01L 33/50* (2010.01)
*H01L 51/00* (2006.01)

(56) References Cited

U.S. PATENT DOCUMENTS

| | | |
|---|---|---|
| 5,959,316 A | 9/1999 | Lowery |
| 6,756,084 B2 | 6/2004 | Fulton et al. |
| 6,841,802 B2 | 1/2005 | Yoo |
| 2001/0045350 A1 | 11/2001 | Teshima et al. |
| 2003/0066972 A1 | 4/2003 | Leblans et al. |
| 2004/0007961 A1 | 1/2004 | Srivastava et al. |
| 2004/0169181 A1 | 9/2004 | Yoo |
| 2004/0209190 A1 | 10/2004 | Mori et al. |
| 2005/0001225 A1 | 1/2005 | Yoshimura et al. |
| 2005/0012448 A1 | 1/2005 | Ke et al. |
| 2005/0253130 A1 | 11/2005 | Tsutsumi et al. |
| 2005/0274967 A1 | 12/2005 | Martin et al. |
| 2006/0033040 A1 | 2/2006 | Okada et al. |
| 2007/0228933 A1 | 10/2007 | Maruyama et al. |
| 2008/0122343 A1 | 5/2008 | Maruyama et al. |
| 2008/0231172 A1 | 9/2008 | Chou et al. |
| 2008/0238294 A1 | 10/2008 | Xu et al. |
| 2009/0014736 A1 | 1/2009 | Ibbetson et al. |

FOREIGN PATENT DOCUMENTS

| | | |
|---|---|---|
| EP | 1 541 333 | 6/2005 |
| EP | 1 541 333 A | 6/2005 |
| JP | H08-054500 | 2/1996 |
| JP | 2000-071451 | 3/2000 |
| JP | 2002-050799 A | 2/2002 |
| JP | 2002-352609 A | 12/2002 |
| JP | 2003-075596 | 3/2003 |
| JP | 2003-086846 | 3/2003 |
| JP | 2003-103818 | 4/2003 |
| JP | 2003-197977 | 7/2003 |
| JP | 2004-063826 | 2/2004 |
| JP | 2004-075548 | 3/2004 |
| JP | 2004-170644 | 6/2004 |
| JP | 2004-179644 A | 6/2004 |
| JP | 2004-239713 A | 8/2004 |
| JP | 2004-535494 | 11/2004 |
| JP | 2005-019663 | 1/2005 |
| JP | 2005-125764 A | 5/2005 |
| JP | 2006-063082 | 3/2006 |
| JP | 2006-303001 | 11/2006 |
| JP | 2006-343409 | 12/2006 |
| JP | 2007-103818 A | 4/2007 |
| JP | 2007-214592 | 8/2007 |
| JP | 2007-262375 A | 10/2007 |
| JP | 2008-135537 | 6/2008 |
| JP | 2008-135539 | 6/2008 |
| JP | 2008-250106 A | 10/2008 |
| KR | 10-2006-0040321 A | 5/2006 |
| KR | 10-2006-0128373 A | 12/2006 |
| WO | WO-03/002270 A2 | 1/2003 |
| WO | WO-2007/005013 A1 | 1/2007 |
| WO | WO-2007/025104 A2 | 3/2007 |

OTHER PUBLICATIONS

First Office Action received for Japanese Patent Application No. 2015-069025 issued Feb. 3, 2016, 8 pages with English translation.
Hanyaloglu, Bengi et al., "Low dielectric constant Parylene-F-like films for intermetal dielectric applications," Applied Physics Letters, (1999), vol. 74, No. 4, pp. 606-608.
Second Notice of Preliminary Rejection received for Korean Patent Application No. 10-2011-7013271 issued Jan. 27, 2016, 9 pages with English translation.
English Translation of Decision of Final Rejection on Chinese Application No. 200980154186.3 dated Feb. 15, 2015, 7 pages.
English Translation of First Office Action on Chinese Application No. 200980154186.3 dated Nov. 5, 2012, 4 pages.
English Translation of Fourth Office Action on Chinese Application No. 200980154186.3 dated Aug. 8, 2014, 5 pages.
English Translation of Notice of Reasons for Rejection on Japanese Application No. 2011-536529 dated Dec. 2, 2013, 9 pages.
English Translation of Notice of Reasons for Rejection on Japanese Application No. 2011-536529 dated Oct. 2, 2014, 2 pages.
English Translation of Preliminary Rejection on Korean Application No. 10-2011-7013271 dated May 20, 2015, 8 pages.
English Translation of Search Report on Taiwanese Patent Application No. 98138410 dated Nov. 24, 2014, 1 page.
English Translation of Second Office Action on Chinese Application No. 200980154186.3 dated Jul. 16, 2013, 3 pages.
English Translation of Third Office Action on Chinese Application No. 200980154186.3 dated Jan. 26, 2014, 5 pages.
Final Office Action on U.S. Appl. No. 12/617,673 dated Aug. 27, 2012, 12 pages.
Final Office Action on U.S. Appl. No. 12/617,673 dated Jan. 9, 2015, 9 pages.
International Search Report and Written Opinion in International Application No. PCT/US2009/064434 dated Jun. 28, 2010, 7 pages.
Non-Final Office Action on U.S. Appl. No. 12/617,673 dated Jan. 9, 2012, 10 pages.
Non-Final Office Action on U.S. Appl. No. 12/617,673 dated Jul. 24, 2014, 10 pages.
Official Letter on Taiwanese Application No. 098138410 mail date Dec. 30, 2014, 3 pages (No English translation available).
Partial Supplemental European Search Report dated Apr. 8, 2015 for EP Application No. 09826855.0.
Search Report issued in Chinese Application No. 200980154186.3 dated Jan. 17, 2014.
Second Office Action received for Japanese Patent Application No. 2015-069025 issued Sep. 29, 2016, 9 pages with English translation.
Third Office Action received for Japanese Patent Application No. 2015-069025 issued Mar. 27, 2017, 9 pages.
Extended Search Report received for European Patent Application No. 15167769.7 issued Aug. 31, 2015, 5 pages.
Extended European Search Report dated Nov. 2, 2015, from related European patent application No. 09826855.0.

\* cited by examiner

Prior Art

Prior Art

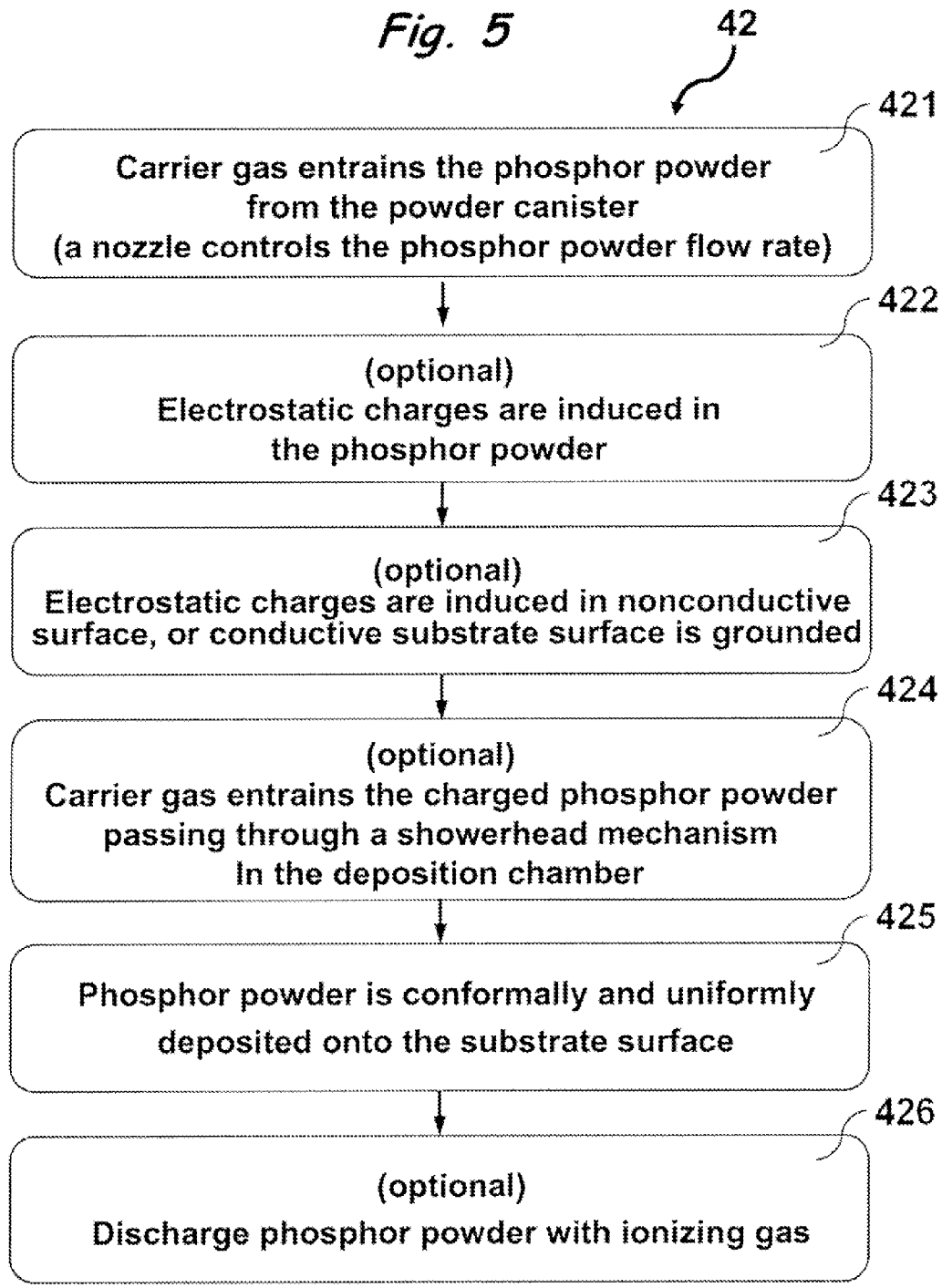

Parylene N

Parylene C

Parylene D

Parylene F

Fig. 7A
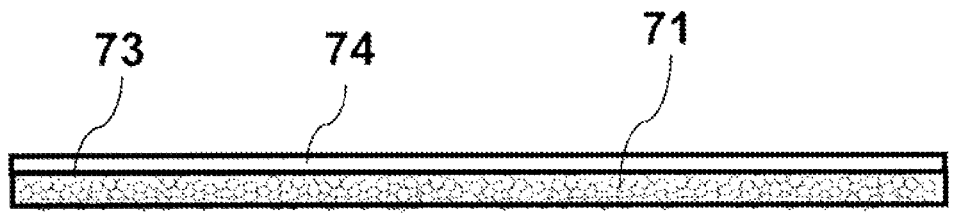
Fig. 7B
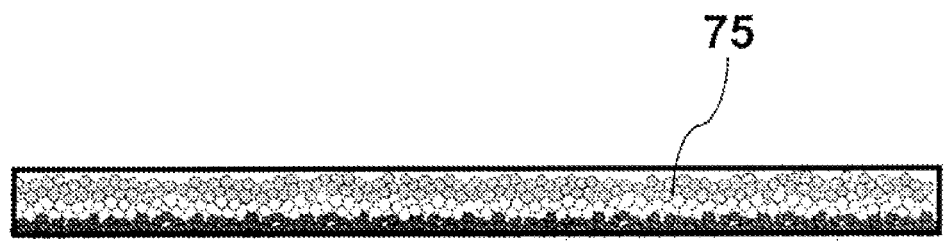

SYSTEM AND METHOD FOR FORMING A THIN-FILM PHOSPHOR LAYER FOR PHOSPHOR-CONVERTED LIGHT EMITTING DEVICES

CROSS-REFERENCE TO RELATED APPLICATION

This application is a divisional of U.S. patent application Ser. No. 12/617,673, filed on Nov. 12, 2009, which claims the benefit of U.S. Provisional Application Ser. No. 61/114,198, filed on Nov. 13, 2008, the disclosure of which is incorporated herein by reference in its entirety.

FIELD OF THE INVENTION

The invention relates generally to light emitting devices and more particularly to a thin-film phosphor deposition process for forming a thin-film phosphor layer adjacent to semiconductor light emitting devices.

BACKGROUND

Solid-State Lighting through Light Emitting Diodes (SSL-LEDs) involves the use of solid-state, inorganic semiconductor light emitting diodes to produce white light for illumination. Like inorganic semiconductor transistors, which displaced vacuum tubes for computation, SSL-LED is a disruptive technology that has the potential to displace vacuum or gas tubes used in traditional incandescent or fluorescent lighting. Advantages of SSL-LEDs over conventional light sources include: (1) higher efficiency and associated energy savings; (2) better color rendering; (3) small form factor; (4) ruggedness; (5) longer operational lifetime and low maintenance; (6) environmentally friendly; and (7) low fabrication costs.

Conventional LEDs typically generate monochromatic light with a narrow emission spectrum, and thus typically lack a broad emission spectrum to provide white light for illumination. In order to generate white light from an LED, a narrowband emission resulting from radiative recombination in the LED is transformed into broadband white light spectrum. Such broadband white light spectrum can be generated by three general approaches. A first approach is a wavelength-conversion approach by using an ultraviolet ("UV") LED to excite multi-color phosphors that emit visible light at down-converted wavelengths. A second approach is a color-mixing approach by combining multiple LEDs, each of which generates light of a different color. A third approach is a hybrid between the two approaches described above. The current generation of commercially available white LEDs is primarily based on this hybrid approach. In particular, primary light emitted from a blue InGaN-based LED is mixed with a down-converted secondary light emitted from a pale-yellow YAG:$Ce^{3+}$-based inorganic phosphor. The combination of partially transmitted blue and re-emitted yellow light gives the appearance of cool (green-blue) white light. Thus, phosphor coating technology is involved for white LEDs using either the wavelength-conversion approach or the hybrid approach.

Current approaches for phosphor coating are described next. A first approach, as depicted in FIG. 1A, is a slurry method involving the use of phosphor grains or particles 1 blended in a liquid polymer system, such as polypropylene, polycarbonate, epoxy resin, or silicone resin. The mixed phosphor slurry is dispensed on or surrounding an LED chip 2, and then the liquid polymer system is dried or cured. The LED chip 2 along with the phosphor slurry can be disposed in a reflector cup 3, as depicted in FIG. 1A. While the slurry method is a convenient phosphor dispensing method, a resulting color uniformity of LEDs manufactured with this slurry method is typically unsatisfactory, and colored rings can be observed from different viewing angles. These deficiencies are the result of: (1) variations in the thickness of a phosphor-containing material surrounding an LED chip can lead to various lengths of optical paths before an emitted light escapes a package; and (2) non-uniform phosphor distribution within the phosphor-containing material (because of gravity and buoyancy effects) tends to move larger phosphor particles downward during a liquid polymer curing process. Moreover, due to variations in the quantity of phosphor powders dispensed surrounding the LED chip, a white color coordinate tends to vary from device to device. These color variations, in turn, result in a complicated white LED color sorting process, the so-called color binning, which attempts to manage the color variations by sorting each device according to its white color coordinate.

To measure the uniformity of emitted light, the variation in a Correlated Color Temperature ("CCT") can be used. A color temperature of a light emitting device can be determined by comparing its hue with a theoretical, heated blackbody radiator. A temperature, expressed in terms of degrees Kelvin, at which the heated blackbody radiator matches the hue of the light emitting device is that device's color temperature. An incandescent light source can be close to being a blackbody radiator, but many other light emitting devices do not emit radiation in the form of a blackbody curve and are, therefore, assigned a CCT. A CCT of a light emitting device is a color temperature of a blackbody radiator that most closely matches the device's perceived color. The higher the Kelvin rating, the "cooler" or more blue the light. The lower the Kelvin rating, the "warmer" or more yellow the light. By measuring the CCT at different light emission angles and comparing this variation among different light emitting devices, the uniformity of the light produced can be quantified. A blue LED chip dispensed with a yellow phosphor by the slurry method can have a typical CCT that varies from about 5,800 K to about 7,200 K across a range of 1,400 K for light emission angles at ±70° from a center light-emitting axis of the LED. Because of the presence of colored rings, the CCT is typically higher at or near the center axis than in the periphery, where the emitted light tends to be more yellow.

A second phosphor coating method is an Electrophoretic Deposition ("END") method for the manufacture of phosphor-converted white LEDs, as depicted in FIG. 1B. In the case of END, a phosphor is electrically charged by adding a proper amount of an electrolyte in a liquid solvent to form a liquid suspension, and is biased by an electrical field. Then, surface charged phosphor particles are moved to an electrode of counter-polarity and coated on the electrode. EPD of the phosphor particles creates a phosphor layer 4 of relatively uniform thickness that can produce white light of greater uniformity and reduced instances of colored rings. While achieving greater color uniformity, the EPD method is generally lacking in its ability to deposit phosphors directly over an electrically nonconductive surface. In commercial production, a phosphor layer is typically coated directly over a LED chip 5, according to the so-called proximate phosphor configuration. This configuration tends to be inefficient in terms of light scattering, since the proximate phosphor layer can direct about 60% of total white light emission back towards the LED chip 5, where high loss can occur. Another drawback of the EPD method is that certain phosphors are susceptible to degradation by the solvent, thereby limiting the general applicability of the END method.

More recently and as depicted in FIG. 2, another approach involves forming a luminescent ceramic plate 6 by heating phosphor particles at high pressure until surfaces of the phosphor particles begin to soften and melt. The partially melted particles can stick together to form the ceramic plate 6 including a rigid agglomerate of the particles. The luminescent ceramic plate 6 is disposed in a path of light emitted by an LED chip 7, which is disposed over a set of electrodes 8. While providing benefits in terms of robustness, reduced sensitivity to temperature, and reduced color variations from chip to chip, a resulting package efficiency can be unsatisfactory due to the proximate phosphor configuration.

A scattering efficiency (also sometimes referred to as a package efficiency) is typically between 40% to 60% for commercially available white LEDs, with efficiency losses due to light absorption by internal package components such as an LED chip, a lead frame, or sub-mount. FIG. 3 depicts an example of a phosphor-converted white LED with yellow phosphor 31 powered by a blue LED chip 32, where a primary blue light 34 undergoing color mixing with a secondary light 35 of yellow color to generate a white color. A main source of light loss results from absorption of light by the LED chip 32. Because the LED chip 32 is typically formed of high-refractive index materials, photons tend to be trapped within the LED chip 32 due to Total Internal Reflection ("TIR") once the photons strike and enter the LED chip 32. Another potential source of light loss results from imperfections in a mirror reflector 33 in the LED package.

Several scenarios depicted in FIG. 3 can direct light to the highly absorbent LED chip 32. First, a primary light 36 emitted by the LED chip 32 can be reflected back to the chip 32 by the phosphor powders 31 or by the mirror reflector 33. Second, down-converted secondary light 37 emitted by the phosphor powders 31 can scatter backward towards the LED chip 32. Third, both primary light and secondary light 38 can be reflected back towards the chip 32 due to TIR at an air-LED package interface. To improve the probability of light escaping from the package, a hemispheric lens 39 can be used to reduce instances of TIR at the air-package interface. To reduce instances of backward scattered light striking the LED chip 32, the phosphor powders 31 desirably should not be placed directly over the chip surface, but rather should be placed at a certain distance from the LED chip 32. Furthermore, a thinner phosphor layer would reduce instances of backward scattering of secondary light by the phosphor powders 31.

It is against this background that a need arose to develop the thin-film phosphor deposition process and related devices and systems described herein.

SUMMARY

Certain embodiments of the invention relate to the formation of a thin-film phosphor layer of substantially uniform thickness that can be conformally disposed in an optical path of an LED, thereby producing substantially uniform white light with little or no colored rings. This thin-film phosphor layer can be prepared by an improved deposition method involving: (1) forming a phosphor powder layer that is substantially uniformly deposited on a substrate surface; and (2) forming a polymer binder layer to fill gaps among loosely packed phosphor particles, thereby forming a substantially continuous, thin-film phosphor layer. Phosphor conversion efficiency of the thin-film phosphor layer can be significantly improved because a thinner layer of a precisely controlled quantity of phosphor powders can be disposed in an optical path, thereby reducing light scattering losses. Also, color homogeneity of the thin-film phosphor layer can be significantly improved due to substantially uniform deposition of phosphor particles. One method of forming an uniform, thin-film phosphor layer is to introduce electrostatic charges among phosphor particles during deposition of the phosphor particles. The electrostatic charges among the phosphor particles can self-balance and adjust their distribution, thereby promoting a substantially uniform distribution of the phosphor particles. Another method of forming an uniform, thin-film phosphor layer is through a phosphor dispensing mechanism, such as a showerhead mechanism in a deposition chamber, or through a rotational substrate holding mechanism, such as a turn table that holds a substrate. In addition to improved efficiency and color homogeneity, temperature stability of the thin-film phosphor layer can be significantly improved because the polymer binder layer can be thermally stable up to at least about 300° C. or more.

Advantageously, white color consistency can be maintained in a tight color coordinate by a coating process with precisely controlled quantities of deposited phosphor particles through a phosphor powder delivery mechanism. White color rendering can be precisely tuned with a layer-by-layer sequential deposition of multi-color phosphors, such as deposition of a red phosphor layer, deposition of a green phosphor layer, and then deposition of a blue phosphor layer. The ratio of multi-color phosphors can be precisely controlled in a resulting composite multi-color phosphor film stack. Thus, the color coordinate and CCT of a white LED fabricated by the phosphor thin-film process can be precisely controlled. This, in turn, can significantly simplify (or even avoid) a binning process.

According to some embodiments of the invention, a consistent white color coordinate can be achieved from lightly varied blue LED chips by tuning the dosage of a multi-color phosphor film stack. This color compensation method can compensate for color variations of the blue LED chips using different compositions or amounts of phosphor contents. In such manner, white LED yield can be significantly increased for color sensitive applications, such as display backlighting using white LEDs.

According to one embodiment of the invention, a thin-film phosphor coating method is a batch phosphor coating process. Multiple LED chips can be deposited with thin-film phosphor in one coating operation. According to another embodiment of the invention, multiple LED lenses can be deposited with thin-film phosphor in one coating operation. Similar to semiconductor chip manufacturing, a manufacturing cost per LED chip can be significantly reduced, and a manufacturing throughput can be significantly increased by a batch process.

As contrasted to EPD, deposition of a thin-film phosphor layer can be used to form conformal thin-film phosphor layers directly over an electrically nonconductive surface. The conformal thin-film phosphor also can be deposited on a non-flat surface, such as a convex or concave surface of an LED lens.

Some embodiments of the invention relate to a system for depositing a conformal thin-film phosphor layer on a substrate. The system can include a deposition chamber, a phosphor powder delivery subsystem, and a polymer precursor delivery subsystem configured to deliver a gas phase monomer to the deposition chamber. The system also can include a memory and a processor in electrical communication with the deposition chamber, the phosphor powder delivery subsystem, and the polymer precursor delivery subsystem, wherein the memory can include code or instructions stored therein and executable by the processor to form a thin-film phosphor layer.

One specific embodiment of the invention relates to a method of forming a thin-film phosphor layer for use in a light emitting device. The method includes: (1) transporting, using a carrier gas, a phosphor powder from a source of the phosphor powder to a deposition chamber; and (2) depositing the phosphor powder adjacent to a substrate within the deposition chamber so as to substantially uniformly distribute the phosphor powder adjacent to a surface of the substrate.

Another specific embodiment of the invention also relates to a method of forming a thin-film phosphor layer for use in a light emitting device. The method includes: (1) forming a first phosphor powder layer adjacent to a substrate, the first phosphor powder layer including first phosphor particles that are distributed adjacent to a surface of the substrate; and (2) forming, via vapor deposition, a first polymer layer adjacent to the first phosphor powder layer, the first polymer layer serving as a binder for the first phosphor particles.

Another specific embodiment of the invention relates to a system to form a thin-film phosphor layer on a substrate. The system includes: (1) a deposition subsystem defining an enclosure to accommodate the substrate; (2) a phosphor powder delivery subsystem configured to deliver, using a carrier gas, a phosphor powder form a source of the phosphor powder to the deposition subsystem; (3) a polymer precursor delivery subsystem configured to deliver polymer precursors in a vapor phase to the deposition subsystem; and (4) a control subsystem connected to the deposition subsystem, the phosphor powder delivery subsystem, and the polymer precursor delivery subsystem, wherein the control subsystem is configured to control the phosphor powder delivery subsystem to deliver the phosphor powder to the deposition subsystem for a first time interval to form a phosphor powder layer adjacent to the substrate, and the control subsystem is configured to control the polymer precursor delivery subsystem to deliver the polymer precursors to the deposition subsystem for a second time interval to form a polymer layer adjacent to the phosphor powder layer.

Another specific embodiment of the invention relates to a light emitting device, which includes: (1) a substrate; (2) a phosphor powder layer substantially uniformly distributed adjacent to the substrate; and (3) a parylene-based polymer layer conformally deposited adjacent to the phosphor powder layer as a binder material to form a substantially continuous thin film, wherein the phosphor powder layer includes a single-color phosphor.

A further specific embodiment of the invention relates to a light emitting device, which includes: (1) a substrate; (2) multiple phosphor powder layers substantially uniformly distributed adjacent to the substrate, the phosphor powder layers being configured to emit light of different colors; and (3) multiple parylene-based polymer layers, each of the parylene-based polymer layers being conformally deposited adjacent to a respective one of the phosphor powder layers, each of the parylene-based polymer layers being a binder material for a respective one of the phosphor powder layers to fill voids among constituent phosphor particles.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

FIG. 5 is a flow diagram depicting a method of depositing a substantially uniformly distributed phosphor layer, according to an embodiment of the invention.

FIG. 7A depicts a single-color thin-film phosphor layer formed using a conformal, thin-film phosphor deposition process, according to an embodiment of the invention.

FIG. 7B depicts a multi-color thin-film phosphor composite layer formed using a conformal thin-film phosphor deposition process, according to an embodiment of the invention.

DETAILED DESCRIPTION

Definitions

Figure 1A:
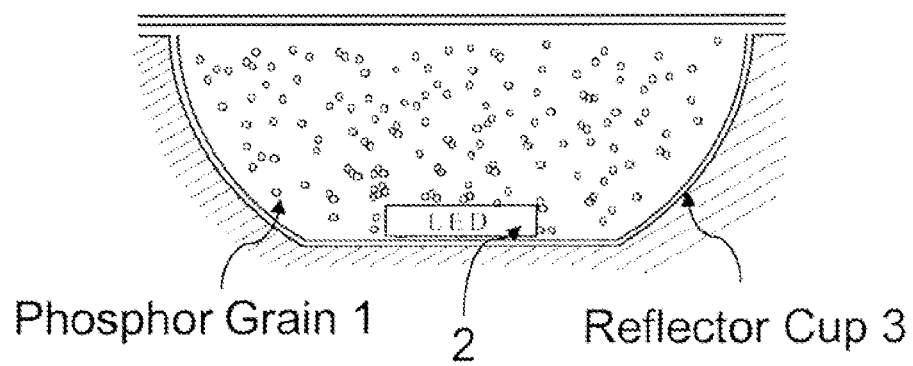
FIG. 1A depicts a proximate phosphor-in-cup configuration of a conventional white LED formed using a slurry method.
Figure 1B:
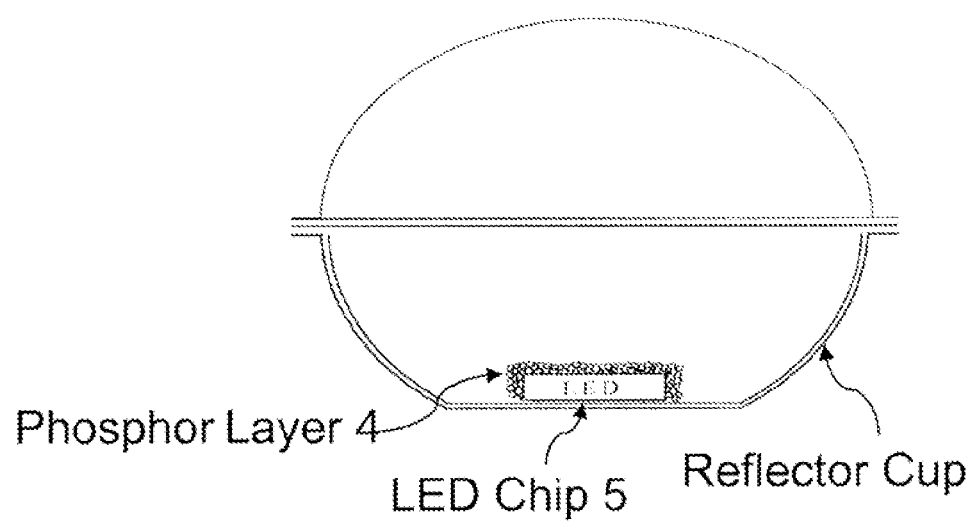
FIG. 1B depicts a proximate phosphor configuration of a conventional white LED formed using EPD.
Figure 2:
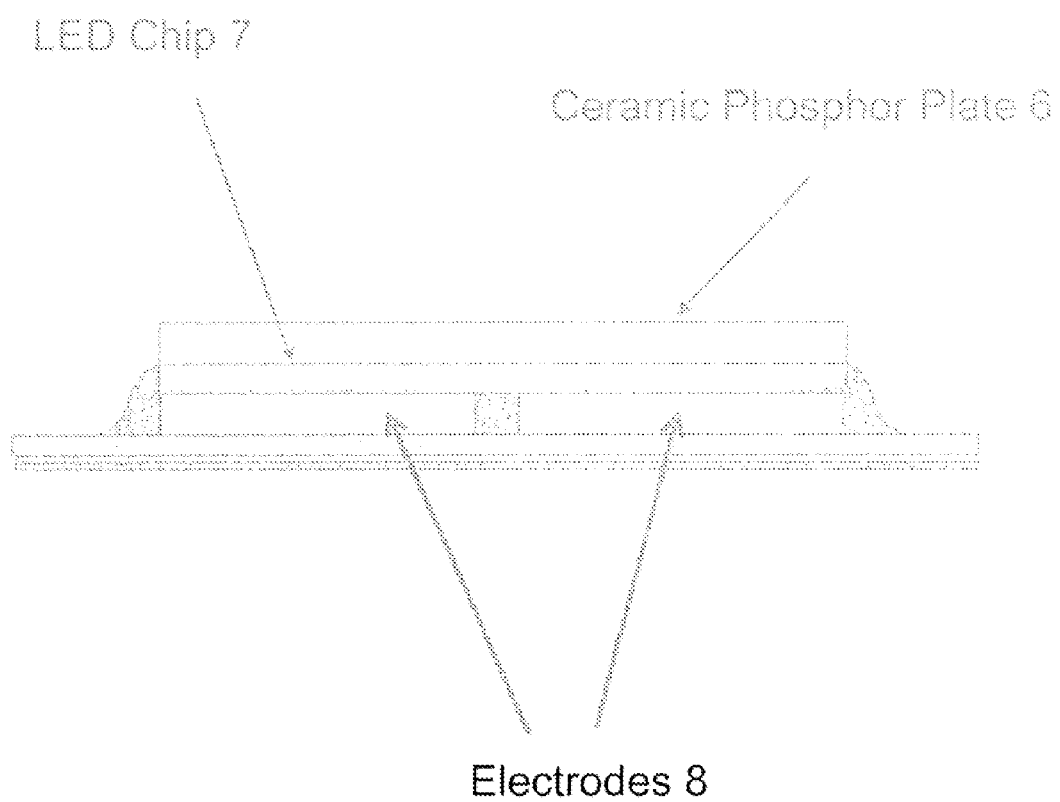
FIG. 2 depicts a proximate phosphor configuration of a conventional white LED formed by lamination with a luminescent ceramic plate.
Figure 3:
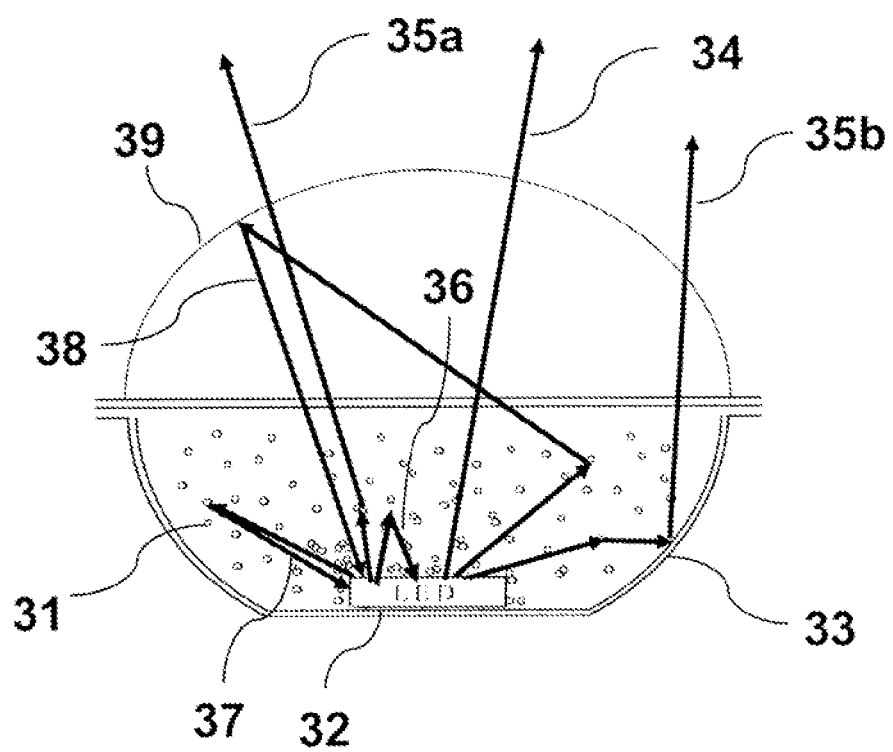
FIG. 3 depicts sources of light losses resulting from light scattering by phosphor powders, TIR at material interfaces, and light absorption at a surface of an LED.

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, the terms "connect," "connected," and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current, while the terms "electrically nonconductive" and "electrical nonconductivity" refer to a lack of ability to transport an electric current. Electrically conductive materials typically correspond to those materials that exhibit little or no opposition to flow of an electric current, while electrically nonconductive materials typically correspond to those materials within which an electric current has little or no tendency to flow. One measure of electrical conductivity (or electrical nonconductivity) is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$, while an electrically nonconductive material is one having a conductivity less than about $10^4$ such as less than or equal to about $10^3$ $S \cdot m^{-1}$ or less than or equal to about $10^2$ $S-m^{-1}$. Electrical conductivity (or electrical nonconductivity) of a material can sometimes vary with temperature. Unless otherwise specified, electrical conductivity (or electrical nonconductivity) of a material is defined at room temperature.

As used herein with respect to photoluminescence, the term "quantum efficiency" refers to a ratio of the number of output photons to the number of input photons.

As used herein, the term "size" refers to a characteristic dimension. In the case of a particle that is spherical, a size of the particle can refer to a diameter of the particle. In the case of a particle that is non-spherical, a size of the particle can refer to an average of various orthogonal dimensions of the particle. Thus, for example, a size of a particle that is a spheroidal can refer to an average of a major axis and a minor axis of the particle. When referring to a set of particles as having a particular size, it is contemplated that the particles can have a distribution of sizes around that size. Thus, as used herein, a size of a set of particles can refer to a typical size of a distribution of sizes, such as an average size, a median size, or a peak size.

As used herein, the term "alkane" refers to a saturated hydrocarbon molecule. For certain applications, an alkane can include from 1 to 100 carbon atoms. The term "lower alkane" refers to an alkane that includes from 1 to 20 carbon atoms, such as, for example, from 1 to 10 carbon atoms, while the term "upper alkane" refers to an alkane that includes more than 20 carbon atoms, such as, for example, from 21 to 100 carbon atoms. The term "branched alkane" refers to an alkane that includes one or more branches, while the term "unbranched alkane" refers to an alkane that is straight-chained. The term "cycloalkane" refers to an alkane that includes one or more ring structures. The term "heteroalkane" refers to an alkane that has one or more of its carbon atoms replaced by one or more heteroatoms, such as, for example, N, Si, S, O, and P. The term "substituted alkane" refers to an alkane that has one or more of its hydrogen atoms replaced by one or more substituent groups, such as, for example, halo groups, hydroxy groups, alkoxy groups, carboxy groups, thio groups, alkylthio groups, cyano groups, nitro groups, amino groups, alkylamino groups, dialkylamino groups, silyl groups, and siloxy groups, while the term "un-substituted alkane" refers to an alkane that lacks such substituent groups. Combinations of the above terms can be used to refer to an alkane having a combination of characteristics. For example, the term "branched lower alkane" can be used to refer to an alkane that includes from 1 to 20 carbon atoms and one or more branches. Examples of alkanes include methane, ethane, propane, cyclopropane, butane, 2-methylpropane, cyclobutane, and charged, hetero, or substituted forms thereof.

As used herein, the term "alkyl group" refers to a monovalent form of an alkane. For example, an alkyl group can be envisioned as an alkane with one of its hydrogen atoms removed to allow bonding to another group of a molecule. The term "lower alkyl group" refers to a monovalent form of a lower alkane, while the term "upper alkyl group" refers to a monovalent form of an upper alkane. The term "branched alkyl group" refers to a monovalent form of a branched alkane, while the term "unbranched alkyl group" refers to a monovalent form of an unbranched alkane. The term "cycloalkyl group" refers to a monovalent form of a cycloalkane, and the term "heteroalkyl group" refers to a monovalent form of a heteroalkane. The term "substituted alkyl group" refers to a monovalent form of a substituted alkane, while the term "un-substituted alkyl group" refers to a monovalent form of an unsubstituted alkane. Examples of alkyl groups include methyl, ethyl, n-propyl, isopropyl, cyclopropyl, butyl, isobutyl, t-butyl, cyclobutyl, and charged, hetero, or substituted forms thereof.

As used herein, the term "arene" refers to an aromatic hydrocarbon molecule. For certain applications, an arene can include from 5 to 100 carbon atoms. The term "lower arene" refers to an arene that includes from 5 to 20 carbon atoms, such as, for example, from 5 to 14 carbon atoms, while the term "upper arene" refers to an arene that includes more than 20 carbon atoms, such as, for example, from 21 to 100 carbon atoms. The term "monocyclic arene" refers to an arene that includes a single aromatic ring structure, while the term "polycyclic arene" refers to an arene that includes more than one aromatic ring structure, such as, for example, two or more aromatic ring structures that are bonded via a carbon-carbon single bond or that are fused together. The term "heteroarene" refers to an arene that has one or more of its carbon atoms replaced by one or more heteroatoms, such as, for example, N, Si, S, O, and P. The term "substituted arene" refers to an arene that has one or more of its hydrogen atoms replaced by one or more substituent groups, such as, for example, alkyl groups, alkenyl groups, alkynyl groups, iminyl groups, halo groups, hydroxy groups, alkoxy groups, carboxy groups, thio groups, alkylthio groups, cyano groups, nitro groups, amino groups, alkylamino groups, dialkylamino groups, silyl groups, and siloxy groups, while the term "un-substituted arene" refers to an arene that lacks such substituent groups. Combinations of the above terms can be used to refer to an arene having a combination of characteristics. For example, the term "monocyclic lower alkene" can be used to refer to an arene that includes from 5 to 20 carbon atoms and a single aromatic ring structure. Examples of arenes include benzene, biphenyl, naphthalene, pyridine, pyridazine, pyrimidine, pyrazine, quinoline, isoquinoline, and charged, hetero, or substituted forms thereof.

As used herein, the term "aryl group" refers to a monovalent form of an arene. For example, an aryl group can be envisioned as an arene with one of its hydrogen atoms removed to allow bonding to another roup of a molecule. The term "lower aryl group" refers to a monovalent form of a lower arene, while the term "upper aryl group" refers to a monovalent form of an upper arene. The term "monocyclic aryl group" refers to a monovalent form of a monocyclic arene, while the term "polycyclic aryl group" refers to a monovalent form of a polycyclic arene. The term "heteroaryl group" refers to a monovalent form of a heteroarene. The term "substituted aryl group" refers to a monovalent form of a substituted arene, while the term "un-substituted arene group" refers to a monovalent form of an unsubstituted arene. Examples of aryl groups include phenyl, biphenylyl, naphthyl, pyridinyl, pyridazinyl, pyrimidinyl, pyrazinyl, quinolyl, isoquinolyl, and charged, hetero, or substituted forms thereof.

As used herein, the term "arylene group" refers to a bivalent form of an arene. For example, an arylene group can be envisioned as an arene with two of its hydrogen atoms removed to allow bonding to one or more additional groups of a molecule. The term "lower arylene group" refers to a bivalent form of a lower arene, while the term "upper arylene group" refers to a bivalent form of an upper arene. The term "monocyclic arylene group" refers to a bivalent form of a monocyclic arene, while the term "polycyclic arylene group" refers to a bivalent form of a polycyclic arene. The term "heteroarylene group" refers to a bivalent form of a heteroarene. The term "substituted arylene group" refers to a bivalent form of a substituted arene, while the term "un-substituted arylene group" refers to a bivalent form of an unsubstituted arene. Examples of arylene groups include phenylene, biphenylylene, naphthylene, pyridinylene, pyridazinylene, pyrimidinylene, pyrazinylene, quinolylene, isoquinolylene, and charged, hetero, or substituted forms thereof.

Conformal Thin-Film Phosphor Deposition Process

Figure 4:
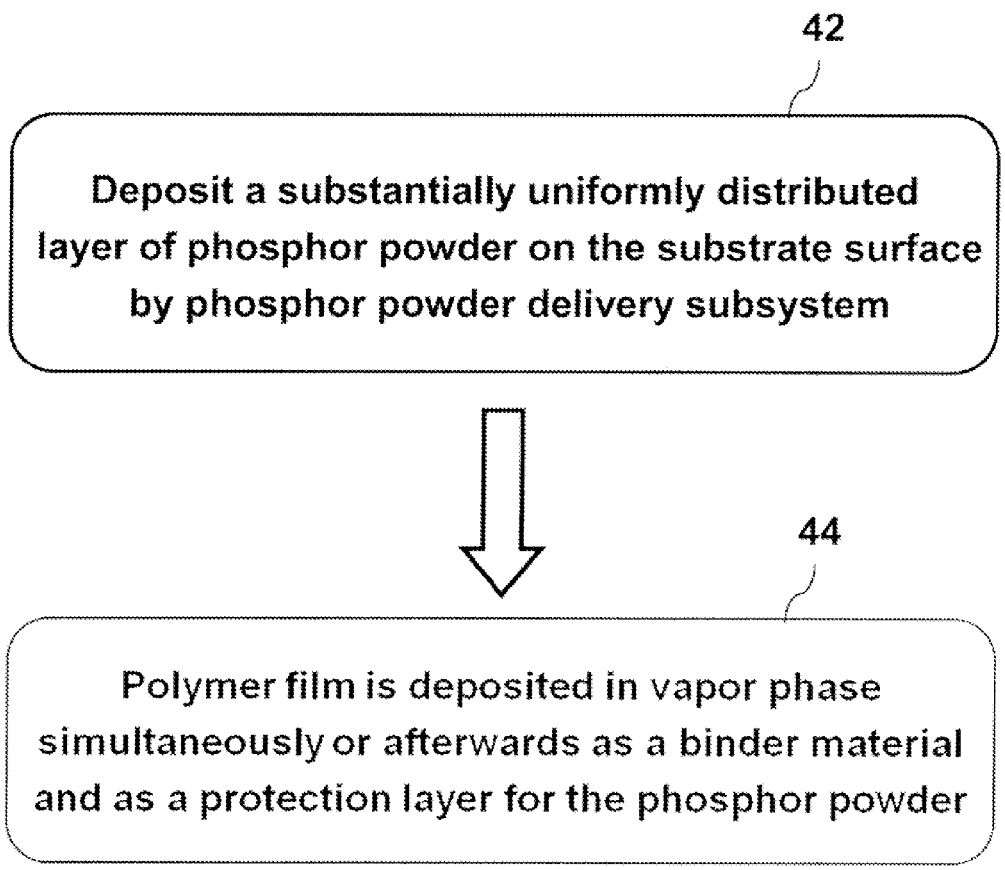
FIG. 4 is a flow diagram depicting a method of forming a conformal, thin-film phosphor layer, according to an embodiment of the invention.

Certain embodiments of the invention relate to a thin-film conformal phosphor deposition process for phosphor-converted white LEDs. This process facilitates achieving the goal of increasing light scattering efficiency for white LEDs by providing a thin-film and remote phosphor layer configuration. According to the improved process as depicted in FIG. 4, a thin-film phosphor layer can be substantially uniformly and conformally deposited on a flat or non-flat and electrically conductive, semiconductive, or nonconductive surface by two operations: (1) forming a phosphor powder layer that is substantially uniformly deposited on the substrate surface (operation 42); and (2) forming a polymer binder layer to fill gaps among phosphor particles to form a substantially continuous layer of thin film (operation 44). The deposition process of forming the thin-film phosphor layer is desirably held in a vacuum chamber. However, it will be appreciated that the deposition process also can take place in a deposition chamber filled with an inert gas, such as nitrogen, or in an atmospheric environment.

In accordance with the process of FIG. 4, a variety of phosphors can be used. Typically, a phosphor is formed from a luminescent material, namely one that emits light in response to an energy excitation. Luminescence can occur based on relaxation from excited electronic states of atoms or molecules and, in general, can include, for example, chemiluminescence, electroluminescence, photoluminescence, thermoluminescence, triboluminescence, and combinations thereof. For example, in the case of photoluminescence, which can include fluorescence and phosphorescence, an excited electronic state can be produced based on a light excitation, such as absorption of light. Phosphors useful in accordance with the process of FIG. 4 include a variety of inorganic host materials doped by activator ions such as $Ce^{3+}$ and $Eu^{2+}$, including garnets (e.g., $(Y_{1-a}Gd_a)_3(Al_{1-b}Ga_b)_5O_{12}:Ce^{3+}$ with a, b≤0.2 or YAG:$Ce^{3+}$), silicates, orthosilicates, sulfides, and nitrides. Garnets and orthosilicates can be used as yellow-emitting phosphors, and nitrides can be used as red-emitting phosphors. However, it will be appreciated that various other types of wavelength-conversion materials can be used, including organic dyes. Desirably, phosphors and other types of wavelength-conversion materials can exhibit photoluminescence with a quantum efficiency that is greater than about 30 percent, such as at least about 40 percent, at least about 50 percent, at least about 60 percent, at least about 70 percent, or at least about 80 percent, and can be up to about 90 percent or more.

Typically, a phosphor used in accordance with FIG. 4 is provided in a powder form, namely as a set of particles. To enhance color uniformity, the particles desirably have sizes in the range of about 1 nm to about 100 μm, such as from about 10 nm to about 30 μm, from about 100 nm to about 30 μm, from about 500 nm to about 30 μm, or from about 1 μm to about 30 μm.

Referring to operation 42 of FIG. 4, the phosphor powder can be transported and deposited over the substrate surface by inertia effects, Brownian movement, thermophoresis, or electrical fields if the phosphor powder is electrically charged. One approach to form a substantially uniformly distributed phosphor powder layer on the substrate surface is to entrain, carry, mobilize, or transport the phosphor powder from a phosphor canister by a set of carrier gases, such as clean, dry air or an inert gas such as nitrogen, and then spray the phosphor powder through a showerhead mechanism in a vacuum, inert gas, or atmospheric chamber. For some embodiments, it is desirable that the phosphor powder is ionized with the same positive or negative electrostatic charge during the phosphor transport process. When the charged phosphor powder is sprayed and deposited on the substrate surface, the constituent phosphor particles are substantially uniformly distributed to form a phosphor powder layer resulting from self-balancing of electrostatic forces among the phosphor particles. Specifically, electrostatic spraying of the phosphor powder involves:

1) The phosphor powder is transported by an inert carrier gas from a phosphor powder canister or other phosphor powder source. Phosphor powder flow volume can be precisely controlled by a nozzle device or other flow control mechanism, as depicted in operation 421 of FIG. 5.
2) The phosphor powder is ionized with the same electrostatic charge, as depicted in operation 422 of FIG. 5. The operation of ionizing the phosphor powder is desirable to substantially uniformly deposit the phosphor powder on the substrate surface. It will be appreciated, however, that this powder ionization operation is optional, and can be omitted for certain embodiments.
3) As depicted in operation 423 of FIG. 5, if the substrate surface is formed of an electrically nonconductive polymer material, the substrate surface is ionized with an opposite electrostatic charge on the substrate surface. If the substrate surface is formed of an electrically conductive material, the substrate surface is grounded, such as by electrically connecting the substrate surface to a ground potential. The operation of ionizing or grounding the substrate surface is desirable to substantially uniformly deposit the phosphor powder on the substrate surface. It will be appreciated, however, that this substrate surface ionizing or grounding operation is optional, and can be omitted for certain embodiments.

4) The carrier gas entrains the charged phosphor powder to the deposition chamber through a showerhead mechanism, thereby evenly distributing the phosphor powder, as depicted in operation 424 of FIG. 5. The showerhead mechanism is desirable to substantially uniformly deposit the phosphor powder on the substrate surface. Alternatively, or in conjunction, the substrate surface is rotated in the deposition chamber using a rotational mechanism so that the phosphor powder can be substantially uniformly deposited on the substrate surface. It will be appreciated, however, that these mechanisms are optional, and can be omitted for certain embodiments.

5) The phosphor powder is conformally and substantially uniformly deposited onto the substrate surface, as depicted in operation 425 of FIG. 5. In one embodiment, the substrate surface is a surface of an LED chip or surfaces of multiple LED chips. In another embodiment, the substrate surface is a surface of an LED lens or surfaces of multiple LED lenses. In another embodiment, the substrate surface is a surface of a glass or quartz substrate. In another embodiment, the substrate surface is a surface of a flexible transparent film, such as one formed of polyethylene terephthalate).

6) The phosphor powder is discharged with ionizing (or de-ionizing) gas, as depicted in operation 426 of FIG. 5. The ionizing gas neutralizes residual electrostatic charges on the phosphor power. It will be appreciated that this discharging operation is optional, and can be omitted for certain embodiments, such as those in which the ionizing operation 422 is omitted.

In the case that the operation 422 of FIG. 5 is implemented, the phosphor powder is ionized with electrostatic charges by one, or a combination, of the following methods:

Corona charging where electric power is used to generate the electrostatic charges Triboelectric charging where the electrostatic charges are generated by friction between the powder and some conduit surface Induction charging where the powder is charged by induction from an electrical field In the case that the operation 423 is implemented for an electrically conductive substrate, the substrate surface can be grounded to maintain an electric field potential for the deposition of the electrostatically charged phosphor powder. Electrostatic charges also can be created on the phosphor powder or an electrically nonconductive substrate surface by Tribo frictional charging. In particular, when two different materials are brought into contact, there can be a transfer of charge from one to the other to offset an imbalance of charges. The magnitude and direction of the charge transfer can depend on a number of factors, including a chemical and electronic structure of both materials. Table 1 sets forth certain materials ranging from those with the most positive charging effect to those with the most negative charging effect when brought into contact.

TABLE 1

| Materials ordered by Triboelectric Charging Effects | |
|---|---|
| Most Positive (+) | |
| Air | |
| Human Hands, Skin | |
| Asbestos | |
| Rabbit Fur | +++ |
| Glass | |
| Human Hair | |
| Mica | |
| Nylon | |
| Wool | |
| Lead | |
| Cat Fur | + |
| Silk | |
| Aluminum | |
| Paper | |
| Cotton | |
| Steel | |
| Wood | |
| Lucite | |
| Sealing Wax | |
| Amber | |
| Rubber Balloon | |
| Hard Rubber | − |
| Mylar | |
| Nickel | |
| Copper | |
| Silver | |
| UV Resist | |
| Brass | |
| Synthetic Rubber | |
| Gold, Platinum | |
| Sulfur | |
| Acetate, Rayon | |
| Polyester | |
| Celluloid | |
| Polystyrene | |
| Orlon, Acrylic | |
| Cellophane Tape | |
| Polyvinylidene chloride (Saran) | |
| Polyurethane | --- |
| Polyethylene | |
| Polypropylene | |
| Polyvinylchloride (Vinyl) | |
| Kel-F (PCTFE) | |
| Silicon | |
| Teflon | |
| Silicone Rubber | |
| Most Negative (−) | |

An opposite electrostatic charge can be created on an electrically nonconductive substrate surface with the Tribo frictional charging method. For example, negative charges can be created on the nonconductive substrate surface by one, or a combination, of the following:

Tribo frictional charging is carried out using a Teflon powder blown through a nonconductive epoxy or silicone resin surface. The Teflon powder can carry electrons away from the epoxy or silicone resin surface to render the surface negatively charged.

An epoxy surface is rubbed with a Nylon brush or cloth.

The phosphor deposition process provides a number of advantages, including:

It can be applied to both a near phosphor configuration and a remote phosphor configuration for phosphor-converted white LEDs.

It can be implemented as a layer-by-layer phosphor deposition process, and can be readily used to form a multi-color phosphor thin-film stack.

The deposition process can be a dry and clean process, without any solvents.

Controlled quantities of phosphors can be used during deposition, thereby significantly reducing color variations and binning issues of white LEDs.

- It can achieve a substantially uniform coating of phosphors by introducing electrostatic charges among phosphor particles.
- It can achieve a high phosphor utilization yield during deposition.

Polymer Layer Deposition Process

In accordance with the thin-film phosphor deposition process of FIG. 4, the deposited phosphor layer is initially a loosely packed powder layer. Next, a polymer thin film is deposited to fill gaps among phosphor particles and to form a substantially continuous thin-film layer, as depicted in operation 44 of FIG. 4. To preserve the substantially uniformly distributed phosphor layer structure, it is desirable to use a Chemical Vapor Deposition ("CVD") process to form this polymer layer as a binder material for the phosphor particles. It will be appreciated that another suitable deposition process can be used in place of, or in conjunction with, CVD to form the polymer layer. Examples of other deposition processes include other vapor deposition processes, such as thermal evaporation, electron-beam evaporation, or physical vapor deposition, as well as spray coating, dip coating, web coating, wet coating, and spin coating.

Figure 6A:
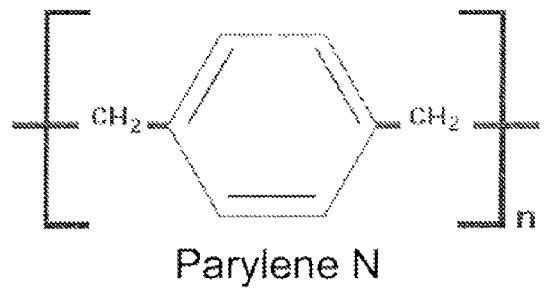
FIG. 6A through FIG. 6D depict examples of a family of polymers that can be used as binder materials to form thin-film phosphor layers, according to an embodiment of the invention.
Figure 6B:
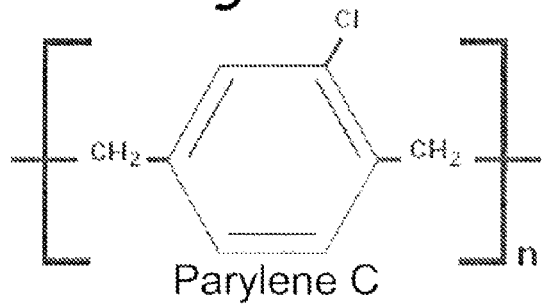
Figure 6C:
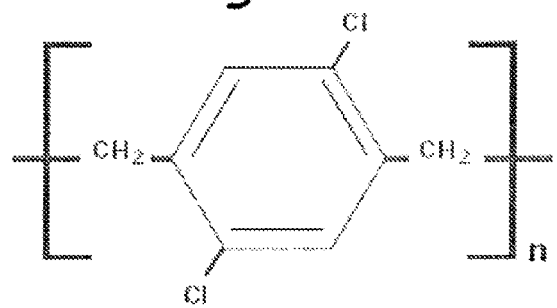
Figure 6D:
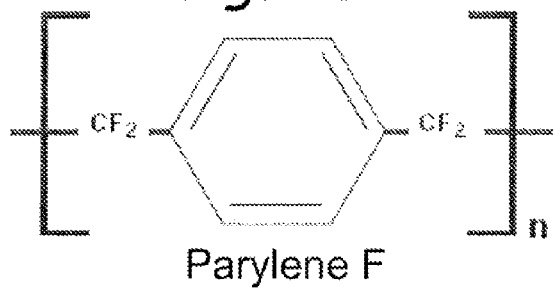

FIG. 6A through FIG. 6D depict examples of a family of conformal coating polymers that can be used to form a binding matrix for a thin-film phosphor layer, according to an embodiment of the invention. In particular, the family of polymers corresponds to a family of parylene-based polymers. Generally, parylene-based polymers correspond to a variety of polyxylylene-based polymers, such as poly(p-xylylene) and its derivatives, and include, for example, polymers having a general repeating unit of the formula —CZZ'—Ar—CZ"Z'"—, wherein Ar is an arylene group (e.g., un-substituted, partially substituted, or fully substituted arylene group, such as phenylene), and wherein Z, Z', Z", and Z'" can be the same or different. In specific embodiments, Ar is $C_6H_{4-x}X_x$, wherein X is a halogen such as Cl or F, x=0, 1, 2, 3, or 4, and Z, Z', Z", and Z'" are independently selected from H, F, alkyl groups, and aryl groups (e.g., $C_6H_{5-x}F_x$ with x=0, 1, 2, 3, 4, or 5). In one specific embodiment, Parylene N depicted in FIG. 6A includes a repeating unit of the formula —$CH_2$—$C_6H_4$—$CH_2$—, and is used as a binder material to form a thin-film phosphor layer. In another embodiment, Parylene C depicted in FIG. 6B including a repeating unit of the formula —$CH_2$—$C_6H_3Cl$—$CH_2$— is used as a binder material to form a thin-film phosphor layer. Parylene C can be produced from the same monomer as Parylene N, but modified with the substitution of a chlorine atom for one of the aromatic hydrogens. In another embodiment, Parylene D depicted in FIG. 6C including a repeating unit of the formula —$CH_2$—$C_6H_2Cl_2$—$CH_2$— is used as a binder material to form a thin-film phosphor layer. Parylene D can be produced from the same monomer as Parylene N, but modified with the substitution of two chlorine atoms for two of the aromatic hydrogens. In another embodiment, a partially fluorinated parylene-based polymer referred to as Parylene F can be used, as depicted in FIG. 6D. Parylene includes a repeating unit of the formula —$CF_2$—$C_6H_4$—$CF_2$—, and can be formed from various precursors, such as $BrCF_2$—$C_6H_4$—$CF_2Br$. It will be appreciated that these parylene-based polymers are provided by way of example, and a variety of other conformal coating polymers can be used. Examples of other suitable polymers include polyimides, fluorocarbon-based polymers (e.g., poly(tetrafluoroethylene)), poly(p-phenylene vinylene), poly(pyrrole), poly(thiophene), poly (2,4-hexadiyn-1,6-diol), fluorocarbon/organosilicon copolymers, poly(ethylene glycol), and their derivatives. Thermal evaporation of acrylics also can be used to form a substantially continuous phosphor film.

Various parylene-based polymer films and other types of polymer films can be formed via a CVD technique of transport polymerization. Transport polymerization typically involves generating a vapor phase reactive intermediate from a precursor molecule at a location remote from a substrate surface, and then transporting the vapor phase reactive intermediate to the substrate surface. The substrate surface can be kept below a melting temperature of reactive intermediates for polymerization. For example, Parylene F can be formed from the precursor $BrCF_2$—$C_6H_4$—$CF_2Br$ by the removal of the bromine atoms to form the reactive intermediate *$CF_2$—$C_6H_4$—$CF_2$*, wherein * denotes a free radical. This reactive intermediate can be formed at a location remote from a deposition chamber, and can be transported into the deposition chamber and condensed over the substrate surface, where polymerization takes place.

More generally, parylene-based polymer films can be formed from a variety of precursors, such as those having the formula $(CZZ'Y)_m$—Ar—$(CZ"Z'"Y')_n$, wherein Ar is an arylene group (e.g., un-substituted, partially substituted, or fully substituted arylene group, such as phenylene), Z, Z', Z", and Z'" can be the same or different, Y and Y' can be the same or different and are removable to generate free radicals, m and n are each equal to zero or a positive integer, and a sum of m and n is less than or equal to a total number of $sp^2$-hybridized carbons on Ar available for substitution. In specific embodiments, Ar is $C_6H_{4-x}X_x$, wherein X is a halogen such as Cl or F, x=0, 1, 2, 3, or 4, and Z, Z', Z", and Z'" are independently selected from H, F, alkyl groups, and aryl groups (e.g., $C_6H_{5-x}F_x$ with x=0, 1, 2, 3, 4, or 5). Other suitable precursors include dimers having the formula $\{(CZZ')$—Ar—$(CZ"Z'")\}_2$, wherein Ar is an arylene group (e.g., un-substituted, partially substituted, or fully substituted arylene group, such as phenylene), and Z, Z', Z", and Z'" can be the same or different. In specific embodiments, Ar is $C_6H_{4-x}X_x$, wherein X is a halogen such as Cl or F, x=0, 1, 2, 3, or 4, and Z, Z', Z", and Z'" are independently selected from H, F, alkyl groups, and aryl groups (e.g., $C_6H_{5-x}F_x$ with x=0, 1, 2, 3, 4, or 5).

One aspect of a parylene-based polymer film, or another type of polymer film, prepared by the CVD method is that it is a conformal coating with superior crevice penetration capability, thereby substantially filling gaps and voids within a phosphor powder layer. In some instances, Parylene F can achieve the best result for gap-filling, while Parylene N can achieve the second best result for gap-filling among the family of parylene-based polymers. Another aspect of a parylene-based polymer is that it has superior optical transparency in the visible light spectrum, rendering it a suitable filler material among a photoluminescent phosphor powder. Another aspect of a parylene-based polymer is that its refractive index can be adjusted based on chemical composition. In one embodiment, a multi-layer of parylene-based polymer films can be formed as a composite thin-film phosphor stack. This multi-layer structure can be formed by depositing a Parylene N film, with a refractive index of about 1.66, as a binder material among a phosphor powder, and then depositing a Parylene F film, with a refractive index of about 1.4, thereby enhancing light extraction due to index matching of the Parylene F film to ambient environment (e.g., air). It will be appreciated that, in general, this multi-layer structure can be formed by depositing a first polymer film, with a first refractive index, as a binder material among a first phosphor powder layer to form a first phosphor layer adjacent to the substrate surface, depositing a second polymer film, with a second refractive index, as a binder material among a second phosphor powder layer to form a second phosphor layer adjacent to the first phosphor layer, and so on, where the first refractive index is greater than or equal to the second refractive index.

Using the CVD method, a parylene-based polymer, or another type of polymer, can be formed as a substantially continuous film having a thickness in the range of a few tens of angstroms to about 100 µm, such as from about 1 nm to about 100 µm, from about 10 nm to about 100 µm, from about 100 nm to about 100 µm, from about 1 µm to about 100 µm, from about 1 µm to about 75 µm, from about 1 µm to about 30 µm, or from about 1 µm to about 10 µm. In some instances, the thickness of the film can exhibit a standard deviation of less than about 20 percent with respect to an average thickness, such as less than about 10 percent or less than about 5 percent. A thickness of the initially deposited phosphor powder layer can be in the range of about 1 nm to about 60 µm, such as from about 10 nm to about 60 µm, from about 100 nm to about 40 µm, or from about 100 nm to about 20 µm. In some instances, the thickness of the phosphor powder layer can exhibit a standard deviation of less than about 20 percent with respect to an average thickness, such as less than about 10 percent or less than about 5 percent. A distribution of the phosphor powder within the resulting film can be substantially uniform across an extent of the film, such that a weight density (e.g., mass or weight of phosphor particles per unit volume) or a number density (e.g., number of phosphor particles per unit volume) can exhibit a standard deviation of less than about 20 percent with respect to an average density, such as less than about 10 percent or less than about 5 percent.

An embodiment of a thin-film phosphor layer prepared by the CVD method is depicted in FIG. 7A. In FIG. 7A, a single-color phosphor powder layer 71, such as a YAG:$Ce^{3+}$-based yellow phosphor, is initially deposited on a substrate surface 72. The substrate surface 72 can be an electrically nonconductive surface, such as a surface of a flexible plastic substrate. A parylene-based polymer layer 73 is deposited, and another parylene-based polymer layer 74 is next deposited. The parylene-based polymer layer 73 serves as a binder or a matrix that at least partially penetrates or surrounds the phosphor powder layer 71, such that phosphor particles of the phosphor powder layer 71 are dispersed within the parylene-based polymer layer 73. It will be appreciated that the parylene-based polymer layers 73 and 74 can be formed from the same material or different materials. In some instances, a refractive index of the parylene-based polymer layer 73 is greater than a refractive index of the parylene-based polymer layer 74.

In accordance with a layer-by-layer deposition of phosphor powders, the CVD method can be used to form a substantially uniformly distributed multi-color phosphor stack. In an embodiment depicted in FIG. 7B, a multi-color phosphor thin-film stack 75 is formed by sequential deposition of a blue phosphor powder, a parylene-based polymer as a binder material for the blue phosphor powder, a green phosphor powder, a parylene-based polymer as a binder material for the green phosphor powder, a red phosphor power, and a parylene-based polymer as a binder material for the red phosphor powder. A resulting phosphor-converted white LED can emit three down-converted secondary lights of respective colors by the phosphors. Thus, a Color Rendering Index ("CRI") of the phosphor-converted white LED can be readily tuned, for example, when used in an indoor general illumination application with a warmer white light and an improved color uniformity. Another application of the phosphor-converted white LED incorporating the multi-color thin-film phosphor stack 75 is for backlighting of Liquid Crystal Displays ("LCDs").

It will be appreciated that the phosphor powder deposition in operation 42 and the polymer deposition in operation 44 need not take place sequentially. Alternatively, these operations can take place substantially simultaneously to form a conformal phosphor thin-film layer.

Thin-Film Phosphor Deposition System

Figure 8:
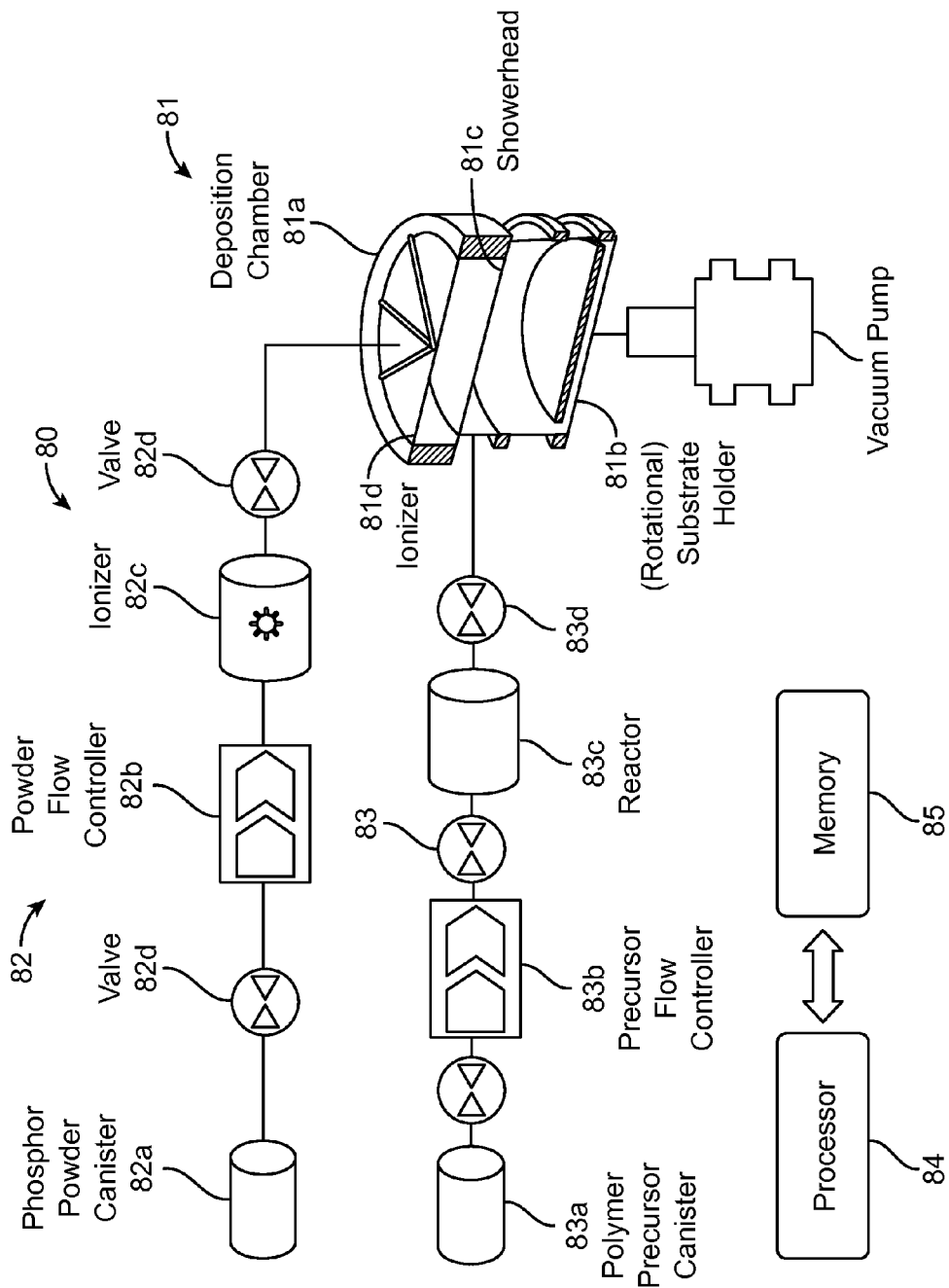
FIG. 8 depicts a system for depositing a conformal, thin-film phosphor layer on a substrate, according to an embodiment of the invention.

FIG. 8 depicts a thin-film phosphor deposition system 80, according to an embodiment of the invention. The thin-film phosphor deposition system 80 can be used to form a conformally coated thin-film phosphor layer by depositing a substantially uniformly distributed phosphor powder layer and then depositing a conformally coated CVD polymer to form a substantially continuous phosphor thin film. The thin-film phosphor deposition system 80 includes: (1) a deposition subsystem or unit 81; (2) a phosphor powder delivery subsystem or unit 82 connected to the deposition subsystem 81; and (3) a parylene-based polymer precursor delivery subsystem or unit 83 connected to the deposition subsystem 81.

The deposition subsystem 81 includes: (1) a deposition chamber 81a, which defines an enclosure within which a substrate is disposed and, for example, is a vacuum chamber with an associated vacuum pump to maintain vacuum conditions, is filled with an inert gas, or is an atmospheric chamber; (2) a substrate holder 81b within the chamber 81a and, for example, is capable of rotating the substrate during the formation of the phosphor film; (3) a showerhead mechanism 81c; and (4) a phosphor powder ionizer 81d, which introduces electrostatic charges among phosphor particles during phosphor powder deposition.

The phosphor powder delivery subsystem 82 includes: (1) a phosphor powder canister 82a or other phosphor powder source; (2) a phosphor flow controller 82b, which regulates a specified quantity of phosphors for each deposition of phosphors; (3) an ionizer 82c, which introduces electrostatic charges among phosphor particles during phosphor powder deposition; and (4) a set of valves 82d.

The parylene-based polymer precursor delivery subsystem 83 includes: (1) a precursor canister 83a or other precursor source; (2) a precursor flow controller 83b, which regulates a specified quantity of precursors for each polymer deposition; (3) a gas reactor 83c, which induces the generation of vapor phase reactive intermediates from precursors; and (4) a set of valves 83d.

In order to deposit parylene-based films, solid or liquid precursors are heated in the stainless canister 83a to a consistent temperature to generate vapor phase precursors. The vapor phase precursors are fed into the gas reactor 83e, which is regulated by the flow controller 83b, as depicted in FIG. 8. The gas reactor 83c splits the precursors into reactive intermediates that bear two unpaired electrons, or diradicals. The diradicals are transported to the deposition chamber 81a shortly after the gas reactor 83c activates the precursors. Because the diradicals can be very reactive, the diradicals can quickly polymerize to form a polymer thin film once the diradicals collide with each other on a substrate surface held inside the deposition chamber 81a.

The thin-film phosphor deposition system 80 also includes a control subsystem or unit, which includes a processor 84 and an associated memory 85 that are connected to other components of the system 80 and serve to direct operation of those components. The memory 85 can include a computer-readable storage medium having computer code stored thereon for performing various computer-implemented operations. The media and computer code can be those specially designed and constructed for the purposes of embodiments of the invention, or they may be of the kind well known and available to those having skill in the computer software arts. Examples of computer-readable media include, but are not limited to: magnetic storage media such as hard disks, floppy disks, and magnetic tape; optical storage media such as Compact Disc/Digital Video Discs ("CD/DVDs"), Compact Disc-Read Only Memories ("CD-ROMs"), and holographic devices; magneto-optical storage media such as floptical disks; and hardware devices that are specially configured to store and execute program code, such as Application-Specific Integrated Circuits ("ASICs"), Programmable Logic Devices ("PLDs"), and ROM and RAM devices. Examples of computer code include, but are not limited to, machine code, such as produced by a compiler, and files containing higher-level code that are executed by a computer using an interpreter. For example, an embodiment of the invention may be implemented using Java, C++, or other object-oriented programming language and development tools. Additional examples of computer code include, but are not limited to, encrypted code and compressed code. Other embodiments of the invention can be implemented using hardwired circuitry in place of, or in conjunction with, computer code.

Advantages of Thin-Film Phosphor Deposition Method

Table 2 sets forth certain advantages of the conformal thin-film phosphor deposition method of some embodiments of the invention, relative to other phosphor coating methods.

TABLE 2

Comparison of Phosphor Coating Methods

|  | Slurry Method | EPD | Ceramic Plate | Conformal Thin-Film Phosphor |
|---|---|---|---|---|
| Spatial Phosphor Distribution | proximate phosphor-in-cup | proximate conformal phosphor | proximate phosphor | remote conformal phosphor |
| Scattering Efficiency | ~50% | ~40% | Slightly better than EPD | ≥ about 90% (e.g., ≥ about 92% or ≥ about 95% and up to about 99% or more) |
| Homogeneity | Poor | Good | Good | Good |
| Color Consistency | Poor | Good | Good | Good |
| Color Rendering | Possible for multi-color phosphor | Single phosphor | Possible for multi-layer ceramic plate | Possible for layer-by-layer phosphor deposition |
| Temperature Stability | Medium | Poor | Good | Best |
| Cost | Die-level process | Batch process | Die-level process | Batch process |

In conjunction with the advantages set forth above, a light emitting device formed in accordance with the conformal thin-film phosphor deposition method can emit white light of greater uniformity. In particular, a CCT variation of a white light LED can be no greater than about 1,000 K over a 140° (±70° from a center light-emitting axis) range of light emission angles, such as no greater than about 800 K, no greater than about 500 K, or no greater than about 300 K, and down to about 200 K or less.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A system to form a thin-film phosphor layer on a substrate, the system comprising:
    a deposition subsystem defining an enclosure to accommodate the substrate;
    a phosphor powder delivery subsystem configured to deliver, using a carrier gas, a phosphor powder from a source of the phosphor powder to the deposition subsystem;
    a polymer precursor delivery subsystem configured to deliver polymer precursors in a vapor phase to the deposition subsystem; and
    a control subsystem connected to the deposition subsystem, the phosphor powder delivery subsystem, and the polymer precursor delivery subsystem, wherein the control subsystem is configured to control the phosphor powder delivery subsystem to deliver the phosphor powder to the deposition subsystem for a first time interval to form a phosphor powder layer adjacent to the substrate, and the control subsystem is configured to control the polymer precursor delivery subsystem to deliver the polymer precursors to the deposition subsystem for a second time interval to form a polymer layer adjacent to the phosphor powder layer.

2. The system of claim 1, wherein the deposition subsystem includes a chamber defining the enclosure, a substrate holder configured to support the substrate within the chamber, and a showerhead mechanism configured to deposit the phosphor powder over the substrate.

3. The system of claim 2, wherein the substrate holder is configured to rotate the substrate.

4. The system of claim 2, wherein the deposition subsystem further includes an ionizer.

5. The system of claim 1, wherein the phosphor powder delivery subsystem includes an ionizer.

6. The system of claim 1, wherein the polymer precursor delivery subsystem includes a gas reactor configured to generate reactive intermediates in a vapor phase from the polymer precursors.

7. The system of claim 6, wherein the gas reactor is configured to generate free radicals from the polymer precursors, and the polymer precursors have the formula: $(CZZ'Y)_m$—Ar—$(CZ''Z'''Y')_n$, wherein Ar is selected from (1) an un-substituted phenylene group, (2) a chlorine-substituted phenylene group of the formula: $C_6H_{4-x}Cl_x$, with x being an integer in the range of 1 to 4, and (3) a fluorine-substituted phenylene group of the formula: $C_6H_{4-x'}F_{x'}$, with x' being an integer in the range of 1 to 4, Z, Z', Z'', and Z''' are independently selected from H, F, alkyl groups, and aryl groups, Y and Y' being removable to generate the free radicals, m and n are each equal to zero or a positive integer, and a sum of m and n is less than or equal to a total number of $sp^2$-hybridized carbons on Ar available for substitution.

8. The system of claim 6, wherein the gas reactor is configured to generate free radicals from the polymer precursors, and the polymer precursors include dimers having the formula: $\{(CZZ')$—Ar—$(CZ''Z''')\}_2$, wherein Ar is selected from (1) an un-substituted phenylene group, (2) a chlorine-substituted phenylene group of the formula: $C_6H_{4-x}Cl_x$, with x being an integer in the range of 1 to 4, and (3) a fluorine-substituted phenylene group of the formula: $C_6H_{4-x'}F_{x'}$, with x' being an integer in the range of 1 to 4, and Z, Z', Z'', and Z''' are independently selected from H, F, alkyl groups, and aryl groups.

\* \* \* \* \*